United States Patent [19]

Reinhart et al.

[11] Patent Number: 5,172,311
[45] Date of Patent: Dec. 15, 1992

[54] ELECTRICAL AMPLIFIER FOR CONTROLLING VALVES

[75] Inventors: Peter Reinhart, Lohr/Main; Karl Hessdörfer, Karlstadt; Horst Lausch, Lohr/Rodenbach, all of Fed. Rep. of Germany

[73] Assignee: Mannesmann Rexroth GmbH, Fed. Rep. of Germany

[21] Appl. No.: 865,623

[22] Filed: Apr. 8, 1992

Related U.S. Application Data

[63] Continuation of Ser. No. 434,370, Nov. 13, 1989, abandoned.

[30] Foreign Application Priority Data

Nov. 11, 1988 [DE] Fed. Rep. of Germany ....... 3838353

[51] Int. Cl.⁵ ............................................. G06F 15/46
[52] U.S. Cl. ................................. 364/140; 364/167.01
[58] Field of Search .................. 364/167.01, 140, 141, 364/142, 188, 189, 509, 510; 137/624.11, 624.18, 624.2

[56] References Cited

U.S. PATENT DOCUMENTS

| | | | |
|---|---|---|---|
| 4,134,423 | 1/1979 | Mayer | 137/486 |
| 4,523,286 | 6/1985 | Koga et al. | 137/551 |
| 4,573,114 | 2/1986 | Ferguson et al. | 364/167.01 |
| 4,595,979 | 6/1986 | Arai et al. | 364/167.01 |
| 4,627,009 | 12/1986 | Holmes et al. | 364/167.01 |
| 4,628,442 | 12/1986 | Isobe et al. | 364/200 |
| 4,628,444 | 12/1986 | Nozawa et al. | 364/167.01 |
| 4,722,044 | 1/1988 | Heiser et al. | 364/167.01 |
| 4,744,022 | 5/1988 | Kumar et al. | 364/167.01 |
| 4,744,218 | 5/1988 | Edwards et al. | 60/368 |
| 4,745,744 | 5/1988 | Cherry et al. | 364/167 |
| 4,754,392 | 6/1988 | Nakashima et al. | 364/167.01 |
| 4,755,729 | 7/1988 | Gotou | 364/167.01 |
| 4,790,233 | 12/1988 | Backe et al. | 364/167.01 |
| 4,816,987 | 3/1989 | Brooks et al. | 364/167.01 |
| 4,879,644 | 11/1989 | Gottshall | 364/167.01 |
| 4,979,127 | 12/1990 | Mizuno et al. | 364/167.01 |

FOREIGN PATENT DOCUMENTS

| | | |
|---|---|---|
| 0094090 | 11/1983 | European Pat. Off. |
| 0149010 | 7/1985 | European Pat. Off. |
| 3414378 | 10/1984 | Fed. Rep. of Germany |
| 3345528 | 6/1985 | Fed. Rep. of Germany |
| 3410082 | 9/1985 | Fed. Rep. of Germany |
| 3521075 | 12/1985 | Fed. Rep. of Germany |
| 3432494 | 3/1986 | Fed. Rep. of Germany |
| 2952500 | 7/1987 | Fed. Rep. of Germany |
| 3700353 | 7/1988 | Fed. Rep. of Germany |
| 3700898 | 7/1988 | Fed. Rep. of Germany |
| 3828591 | 3/1989 | Fed. Rep. of Germany |
| 3935937 | 5/1990 | Fed. Rep. of Germany |

OTHER PUBLICATIONS

Digitale CNC-Streckensteuerung, Mar. 1987.
"One–Axis and Two–Axis Controller User's Manual," including Appendices A, B, C and D, Index and Supplement (Appendices E and F), Feb. 1987.

(List continued on next page.)

Primary Examiner—Jerry Smith
Assistant Examiner—Paul Gordon
Attorney, Agent, or Firm—Harness, Dickey & Pierce

[57] ABSTRACT

Amplifier units for controlling valves, in particular proportional solenoid valves, comprise a number of components such as an end stage, a power supply, a control electronics and possibly a closed loop control including signal inputs for desired and actual values. The control electronics generates a desired positioning characteristic for each type of valve. According to the invention, the control electronics is replaced by a programmable component including a read-only-memory in which the amplifier is associated to a particular type of valve by loading the read-only-memory with valve specific data which specify a particular type of valve. The invention allows to manufacture and to stock non-programmed amplifiers of identical structure. To make an amplifier unit ready for use a particular program is loaded to suit the amplifier to the valve type.

15 Claims, 3 Drawing Sheets

OTHER PUBLICATIONS

Blickley, George J., "Servo Becomes Digital Actuator," Control Engineering, Jun. 1986.

"XPERT" Linear Actuator (XLA) User Manual, Jul. 1986.

Dipl.-Ing. Dieter Scholz, Aachen, "Korrektur von Ventilkennlinien mit Hilfe von Mikorprozessoren," 1986, pp. 209-233.

DE-Prospekt Digitaregler DR 10, Gesellschaft für Antriebs-unde Steuerungstechnik mgH and Co. KG, D-7742 St. Georgen/Schwarzwald, Jul. 1985.

Prof. Dr.-Ing. W. D. Goedecke, Dr. -Ing. R. Schwenzer, DE-Z: Fluid, Apr. 1985, "Wenn die Alltags-Pneumatik nicht reicht".

Dipl.-Ing. Dieter Scholz, Aachen, "Korrektur von Ventilkennlinien mit Hilfe von Mikorprozessoren," 7. Aachener Fluidtechnisches Kolloquium, Mar. 1986.

Verf. H. Rummel, "Baggertechnik am Beispiel des RH 90," Oct. 1987.

Auf der 21 Bauma verteilter Prospekt der Firma O and K, Aufbruch In Neue Leistungs-Dimensionen.

Zeichnungen zur Darstellung eines Pumpen-Managing-Systems, angefertigt durch die Einsprechende Dec. 1983.

Prior use 1983 by Lothar H. Pees "Propcon 10" (Valve amplifier) May 1984.

"System 90 Microcontroller", Sundstrand-Sauer, Apr. 1987.

Fisher, C.: Systeme der elektrohydraulischen Antriebs-und Steuerungstechnik; o+p "Ölhydraulik und pneumatik" 31, (1987), No. 4, pp. 354, 357, 358.

VDI-Berichte vom Sep. 1988, pp. 176, 177, 136.

Pelka "Was ist ein Mikroprozessor", Franzis-Verlag 1981, pp. 8, 9, 16, 17.

Siemens Components 24 (1986) Heft 2, p. 63.

Prior use 1987 by Ottmar Knisch "CPS 10 und CPS 20", Aug. 1987.

"Kraftfahr Technisches Taschenbuch", 1987, pp. 63, 130, 131.

"Elektronik-Lexikon", 1974, pp. 206, 84-86.

Schreiben des VDMA an die Mitarbeiter des AK 13 "Digitale Reglerkarte-Mikrorechner", Oct. 1986.

Catalog, Mannesmann Rexroth RD 29943/1.86 pp. 306(1)-313(7), Jan. 1986.

Catalog, Mannesmann Rexroth RD 29985/10.85 pp. 342(6)-345(3), Oct. 1985.

MOOG Datenblatt D 243.01.01, Sep. 1986.

Hoonhorst, Hans, "Bendix Sequential Fuel Injection," Bendix Electronics, 1986.

Dubbel, Taschenbuch für den Maschinenbau, 1981, p. 1085.

DE-Z: NN: "Impulse für Servo", fluid, Apr. 1987, pp. 24-26.

DE-Bosch Hydraulik, 1987; Elektrohydraulische Regelungstechnik, S. 57.

DE-Z: 8. Aachener Fluidtechnisches Kolloquium, S. 303-321, Dr. Feuser.

DE-Z:8. Aachener Fluidtechnisches Kolloquium, Mar. 15, 1988, S. 323-340, Mauer et al.

DE-Z: Scholz, D.: Ventilansteuerung und-regelung mit digitaler Signalverabeitung. In: o+p olhy-draulik und pneumatik 29, (1985) No. 1, S. 21-24.

DE-Z: Burkel, R., Romes, R.: Integration von Elektronik in Bauelemente der hydraulischen Antriebstechnik. In: o+p olhydraulik und pneumatik 32, (1988), No. 4, S. 231, 232, 234, 236, 239, 240, 242, 244, 246.

DE-Z: Backe, W.: Fluidtechnik im Wandel. In o+p olhydraulik und pneumatik 32, (1988) No. 7, S. 473-476, 479-484.

DE-Z: Anders, P.: Symbiose Mikroelektronik/Fluidtechnik. In: o+p olhydraulik und pneumatik 32, (1988), No. 7, S. 487-492, 494, 497-499.

DE-Z: Burkel, R.: Symbiose Mikroelektronik/-Fluid-technik. In: o+p olhydraulik und pneumatik 32, 1988, No. 7, S. 500-506.

Sloan et al., IBM Technical Disclosure Bulletin, vol. 21, No. 3, Aug. 1978.

ELECTRICAL AMPLIFIER FOR CONTROLLING VALVES

This is a continuation of U.S. patent application Ser. No. 07/434,370, filed Nov. 13, 1989 and now abandoned.

The invention relates to electrical amplifiers for controlling fluid power valves, comprising a supporting structure associated to a valve. The supporting structure includes at least an end stage, a power supply, a control electronics for generating valve specific positioning signals to obtain a predetermined control or output characteristic of said valve. The supporting structure also includes inputs for delivering desired value signals to the control electronics and outputs connected to the endstage. The control electronics or, respectively the supporting structure may be supplemented by a number of components, i.e. at least a controller including inputs for at least an actual value, a ramp generating unit top modulate desired values, inputs for activating desired values, and outputs to a display and to circuits for failure recognition.

BACKGROUND OF THE INVENTION

Conventional amplifiers and closed loop control amplifiers to drive valves, in particular proportional solenoid valves are made up of a number of individual components. Thus the current through the solenoid windings is controlled by an endstage to which power is supplied by a suitable power supply. The amplifier further receives signals defining a number of desired values such as valve piston positions, fluid flow volumes and pressures. Additionally desired values are set by potentiometers and will be supplied to the amplifier by operating switches. Desired values for the piston position of the valve or the height of the pressure for example are generated in an analogue manner. A main component of each amplifier is the control electronics which is connected between the desired value input and the endstage and which generates the positioning signals for the control and output characteristics of the valve in accordance with a valve specific program. This program will vary in response to the function of the valve and the valve size. As an example such control may be employed in directly operated or pilot operated directional proportional valves operating with and without feedback, directly operated or pilot operated pressure valves, pressure limiting valves or pressure reducing valves, further flow valves, directional servo-valves or servo-pressure-valves. Such control amplifier may operate a variety of valves having a predetermined function which requires a certain algorithm for generating positioning signals in the amplifier to obtain a predetermined interrelationship between setting a desired value and generating a suitable output current in the endstage. In addition, the size of the valve and thus the stroke and the geometry of the valve piston must be considered to obtain the proper signal.

These requirements result in control electronics and amplifiers are valve specific. This means that each valve type or at least each valve family needs an individual specifically designed amplifier.

Moreover the control electronics may include further components all known to the artisan. For example to obtain a continuous transient of response from a sudden variation of a desired value a ramp circuit may be useful. Components for the recognition of failure, for example for indicating a broken cable may be helpful. As mentioned before, the amplifier may be a closed loop amplifier so that additional inputs are provided for the feed-back of actual values such as the solenoid current and/or the valve piston position or pressures occuring at the valve or adjusted by the valve. Still further the endstage is controlled by a pulse width modulated signal thus supplying a pulsed current having a fixed or freely selected frequency to the valve solenoid. The forgoing enumeration of individual components of a valve amplifier should not be considered to be complete. Further details are found in the handbooks of valve manufacturers, for example in MANNESMANN REXROTH RD 29003/3.88 "Hydraulic and electronic components for proportional and servo-systems".

The amplifier components are regularly mounted on a supporting plate which in turn may be mounted to suit a specific purpose. Simple circuit amplifiers having a limited number of terminals and lacking setting means such as desired value setters may be mounted in a casing which is called a module. More sophisticated amplifiers which include means for setting valve specific and amplifiers specific parameters such as desired values, ramp times etc. are mounted on a supporting plate including a front plate to accomodate switches, push buttons or display elements. A number of amplifiers of this type are combined in magazines. Modules and magazines are assembled in a switching board. Otherwise it is possible to mount an amplifier directly to a valve adjacent the valve casing or to secure it to a valve sandwich plate.

A substantial disadvantage of the prior art valve amplifiers is the need for a great variety of individual amplifiers to serve the various types of valves and valve sizes to be held on stock so that a particular amplifier which is associated to a particular valve is available. According to the prior art the individual valve types and valve sizes further need specific amplifiers in a variety of embodiments. For example one embodiment for each valve integrated assembly, the modul assembly or the magazine assembly must be stocked. All the various amplifier types must be separately manufactured and held-on stock.

SUMMARY OF THE INVENTION

It is an object of the present invention to avoid the multiplicity of amplifier types referred to above and to simplify the manufacturing process as well as stocking.

The present invention provides an amplifier which overcomes many of the problems associated with the amplifier types previously known.

According to a main feature of the present invention a control electronics is defined by a programmable unit. The programmable unit is programmed to perform all functions necessary for each valve type to generate a particular positioning signal. The unit is connected to a read-only-memory into which the variable and constant values of the individual valve type and the control program for this valve are loaded. Each amplifier thus comprises an endstage, a power supply suitable for the associated valve and the programmable unit including an interface and a read-only-memory in which the valve and amplifier specific data and programs are stored.

All these data are defined to determine the function of the valve, its size and even the manufacturing tolerances as well as different control types and different control gains.

Furthermore the general operational program for the data processing of the programmable unit is stored in the read-only-memory. These data stored are preferably variable so that input-terminals are provided, in particular for digital values to vary the values desired. This may be performed by means of a keyboard. The data may further be fed to a display. This is of particular advantage when initially loaded data are manually varied to optimize the valve characteristic, which varied data are then transferred via the interface to a master processor where the data are stored to be ready for delivery. This is of use when further valves of the same type are to be programmed. According to this embodiment of the invention there is provided a bidirectional data transfer.

In a still further embodiment, the endstage may be located on a supporting structure together with the power supply to which supporting member the programmable unit including the read-only-memory on a so-called daughterplate is soldered or pinned. This daughterplate is identical for all types of valves. Merely the endstages need a few different embodiments since different output-currents are necessary in accordance with the valve size. However, the invention provides for a substantial simplification in stockholding and manufacturing by using a programmable unit and read-only-memory in combination with the non-programmable components such as the endstage and the power stage.

Accordingly the amplifier may be manufactured regardless of the individual valve types to be controlled. Amplifier carrying plates are manufactured which are identical to each other and are different in the endstage only. As a rule, a variety of two or three different endstages will be sufficient so that manufacturing and stock are greatly simplified. To suit an amplifier for a particular type of valve the amplifier is connected via the interface to an external processor from which the complete program and data, such as the amplifier and valve specific data and the program are loaded to the programmable unit and in the read-only-memory. Then the amplifier is programmed for a particular valve type and size.

Further claims relate to particularly useful embodiments of the invention. For example the interface allows for a bidirectional data transfer between the amplifier and an external processor. Accordingly the amplifier may be incorporated in a central control in a plant. Further, the external computer may use data received from the amplifier to optimize the process.

The programmable unit further includes digital and analogue inputs. The analogue inputs for desired values, actual values as feed-back of pressures, valve piston positions and/or current values in the solenoid windings are supplied through an internal multiplexer to an analogue/digital converter. Digital inputs allow read out of desired values stored and further allow performance of additional functions, for example to vary stored parameters and to vary desired values by actuating a keyboard connected thereto.

These additional functions determine the embodiment of the amplifier structure. When a subsequent setting is not necessary for example with an amplifier incorporated in a valve or valve sandwich plate, the amplifier is easily mounted in a casing including a few terminals. When additional input terminals are needed to perform externally controlled functions of the valve, the amplifier unit may be mounted in a module casing. When still further input terminals are desired such as a keyboard and a display allowing to vary and display certain values, the supporting plate is provided with a front plate for accomodation of the key-board and the display elements. According to the invention a particular amplifier plate is associated to a particular valve type. To facilitate this association, a valve code is provided. This means that the amplifier plate receives a valve code in which the associated valve type is binary coded when the amplifier unit is associated to a particular valve. This may be checked by reading out the valve code to make sure that the memory is loaded with the valve specific data only or, respectively, to make sure that the end stage may be activated only when the proper valve code associated thereto is presented. Reading out is performed when the initializing routine is performed i.e. when the initial stage of the amplifier is reset.

DETAILED DESCRIPTION

Figure 1:
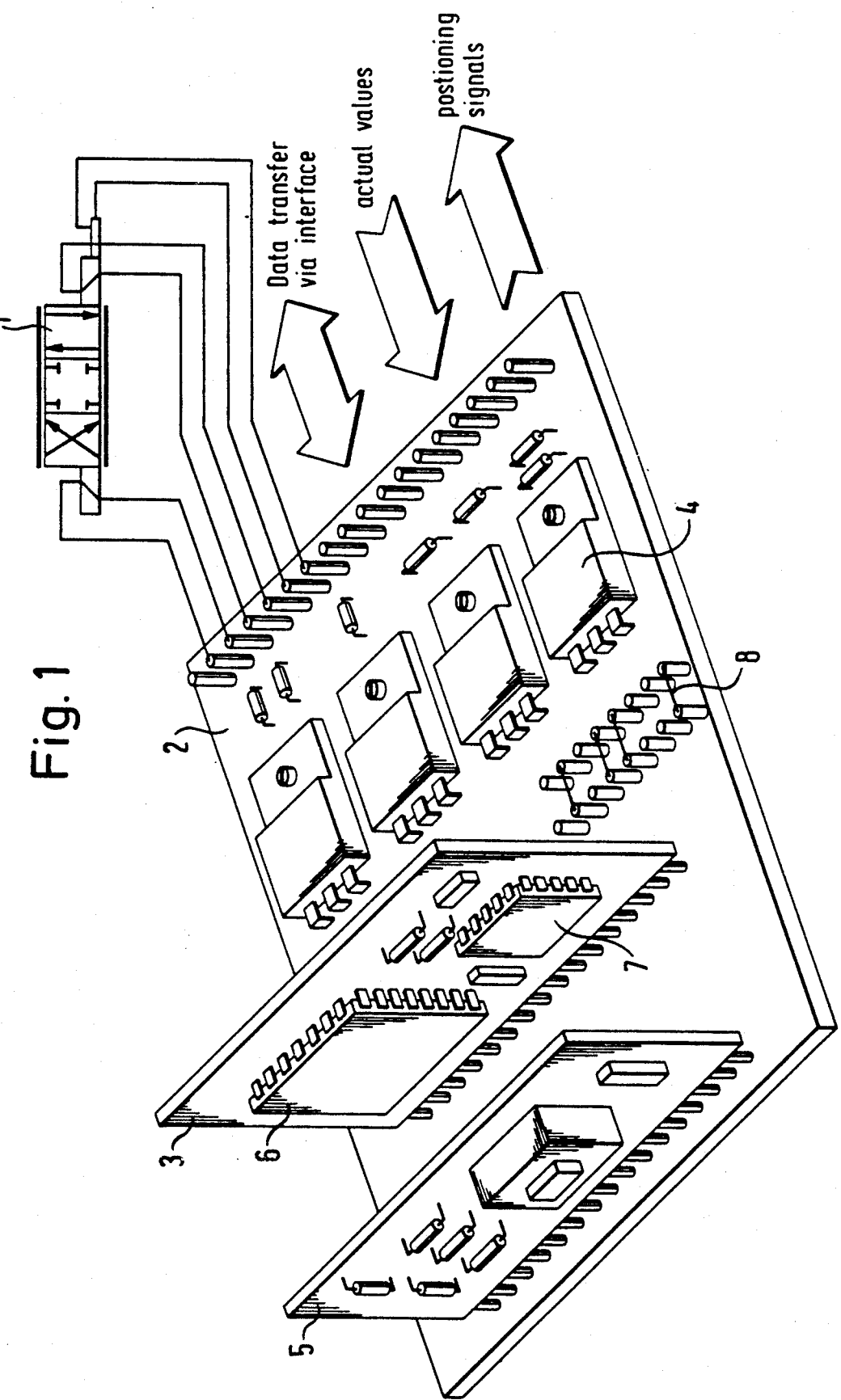
FIG. 1 is a perspective view of an amplifier unit designed for mounting on a valve or valve sandwich plate for controlling a proportional solenoid valve.

Referring now in detail to the drawings, FIG. 1 illustrates an amplifier mounted on a supporting plate 2 for connection to a valve 1. The supporting plate 2 carries an endstage 4 and a power supply 5. A daughter plate 3 for accomodating a programmable unit 6 and a read-only-memory 7 is mounted on the supporting plate 2.

Still further the supporting plate 2 comprises a number of terminals for transmitting and/or receiving signals such as positioning output values, actual values, data exchange with an external computer and terminals for connecting the power supply unit 5 to a line voltage and for electrical connection of the valve 1.

Similar basic supporting plates are provided for all types of valves. They distinguish from each other substantially by different endstages 4 only. By limiting the design to a few embodyments, for example incorporating endstages with two different output current values, the stock required comprises a few different basic units. In FIG. 1 the amplifier controls a directly actuated directional proportional solenoid valve of a predetermined rated size. The program required for control is transmitted from a computer via the interface to the ROM 7 by means of the programmable circuit 6. Accordingly the amplifier for the valve 1 is programmed and ready for operation after being tested for the hardware valve characteristic.

Figure 2:
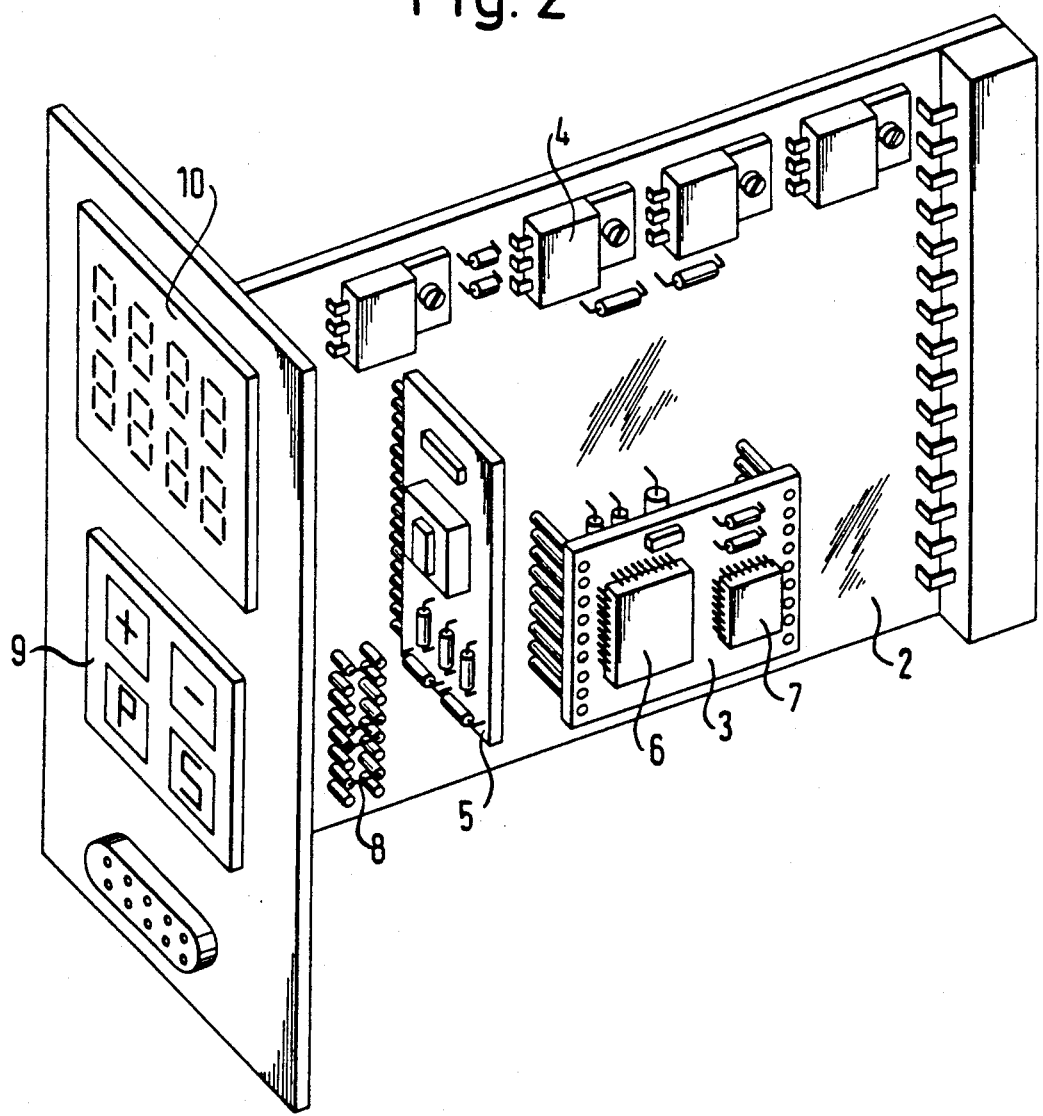
FIG. 2 is a perspective view of an amplifier unit including a front plate (Eurocard system) for controlling a valve and FIG. 3 is a block diagram of an amplifier unit

FIG. 2 illustrates an embodiment of an amplifier unit including a keyboard and display for calling up and changing data and for displaying data. This can take place interactively without standstill of the amplifier. For changing the, the amplifier can be programmed using the keyboard 9 and the display 10. The keyboard further allows to change data in the memory. As shown in FIG. 2, the keyboard 9 and the display 10 are disposed on a front plate of the unit.

Figure 3:
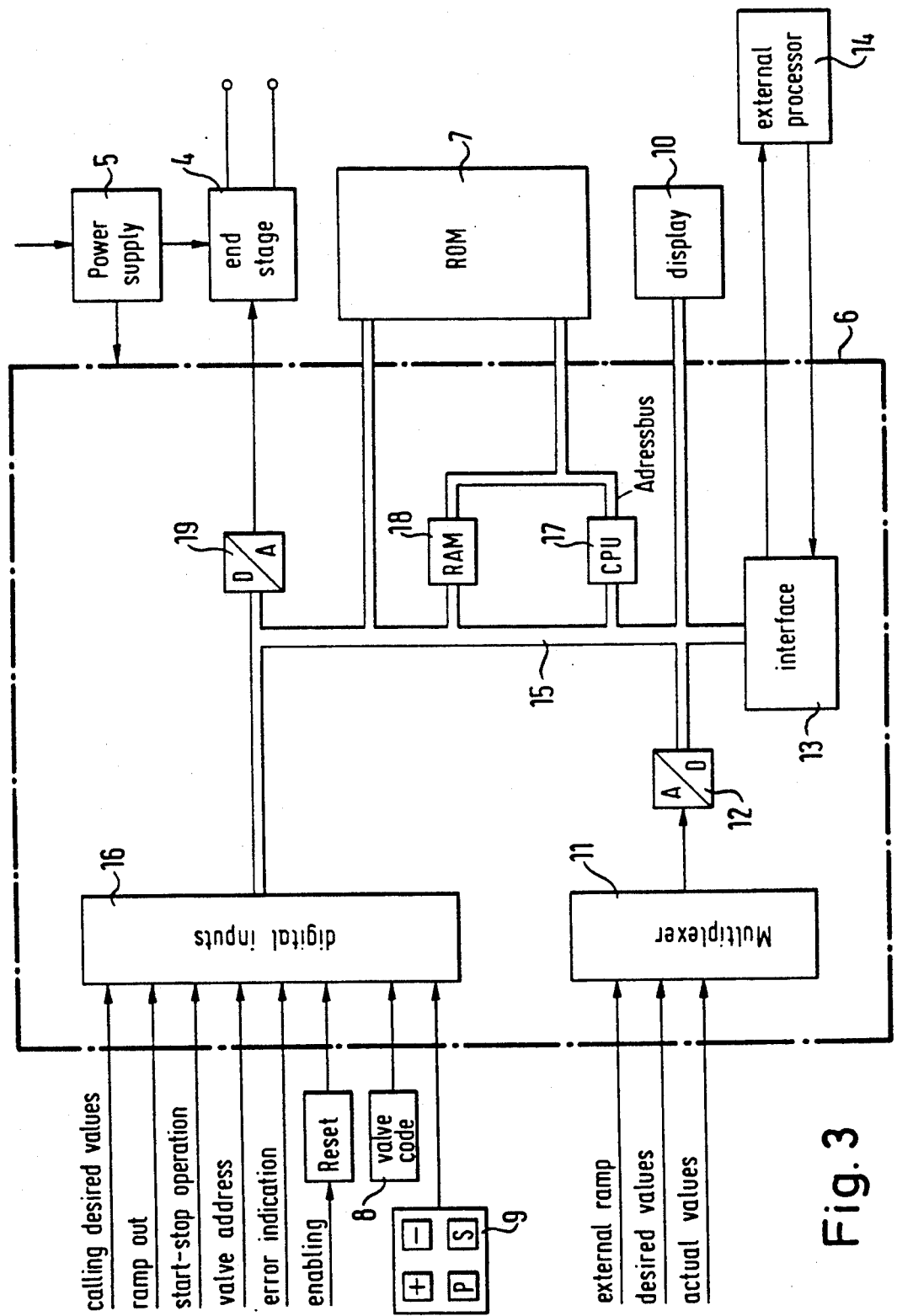

FIG. 3 illustrates the components of the amplifier. The programmable component comprises a multiplexer 11 to which analogue data are applied which are cyclically scanned in the multiplexer 11 and are transferred via an analogue/digital converter 12 to a data bus 15. Additionally a number of digital inputs 16 is provided to the data bus 15. The programmable component further comprises a microprocessor 17 to perform arithmetic calculations, a random excess memory 18 and an interface 13 for a series transfer of data from and to the computer 14. The data transmitted through the interface 13 to program the amplifier are stored in a random memory 7.

In operation the signals defining any desired values as well as the signals defining the actual values are supplied to the programmable unit 6 in which the correlated signals for controlling the endstage are read from the memory 7 and processed. The digital output signal is converted by the digital/analogue unit 19 to an analogue control signal for the endstage 4. The voltage supply of the electronics and of the endstage is provided by the power unit 5. The control may be performed by an external master processor to which the data generated by the amplifier are supplied to optimize the processing control.

The multiplexer 11 is electrically connected to a number of analogue transducers, in particular for receiving measuring signals of a variety of actual values such as pressures, valve piston positions and/or solenoid currents as well as an external ramp time modulator. The amplifier unit is further connected to an analogue desired value setter through the multiplexer 11.

Now turning to the digital input 16 there is a variety of functions. For example any signals defining desired values stored in the ROM 7 may be activated by the input "calling desired values". A total of 15 desired values may be read from the memory in using 4 keys provided the desired value reading is coded correspondingly. Each desired value is associated with at least a predetermined ramp time during which the desired value changes. The associated ramp times are stored a like in the memory.

A further input "ramp out" allows maximization of the ramp time so that the desired value is delivered as a positioning value having a minimum delay which is inherent to the system.

The inputs "start-stop operation" allow control of the valve by means of push-button switches which are located at different places of the plant to continuously adjust the valve towards opening or closing.

Provided the plant comprises a number of identical valves and associated amplifiers, the inputs "valve address" allows to select the valve to be actuated provided the input receives a signal, whereas the desired values for the other valves are not change thereby.

The high concentration of processing data in the amplifying unit makes it possible to recognize and to display errors in response to data processing to improve the safe processing of the positioning value. The error is indicated through a further digital input "error indication". After processing the error signal or, respectively eliminating the error, the amplifier provides an "enabling signal" to reinitiate the control of the valve.

A number of further digital inputs is connected to a valve code means 8 in which the valve type associated to the particular amplifier is binary coded for example by a number of soldering bridges. In order to read the program into the memory 7, the valve code means 8 is checked to make sure that only the software associated to the particular type of valve may be stored.

Finally the keyboard 9 is connected to the digital input 16. The keys allow selection of increment and decrement values and selection of a predetermined program.

What is claimed is:

1. An electrical amplifier unit for controlling any of a selected one of different fluid power valves, comprising a supporting structure associated to the selected valve to be controlled, said supporting structure including at least an endstage, a power supply, a control electronics for generating valve specific positioning signals to obtain a predetermined operation of said valve, and inputs for delivering desired valve parameter value signals to said control electronics and outputs connected to said endstage, characterized in that said control electronics comprises a read-only-memory and a programmable unit including at least a microprocessor, a working memory, analog and digital inputs and outputs including signal convertors, means for loading said read-only-memory with a program of operation, a valve specific program, and a plurality of associated data from said programmable unit and said microprocessor via an interface, wherein said supporting structure further comprises a valve code storing means which provides a binary code for a particular type of valve, said code being read out in performing a checking-mode, and wherein said programmable unit includes a number of digital inputs for loading said valve code in order to compare the valve specific program with the valve code stored in the valve code storing means when performing the checking-mode.

2. The amplifier of claim 1, wherein the data stored is varied via digital inputs of the programmable unit.

3. The amplifier of claim 1, wherein the program of operation, the valve specific program and the associated data can be transferred in either direction via said interface.

4. The amplifier of claim 1, wherein adjustable desired value signals for the valve and operational parameters are loaded to and read out from the read-only-memory.

5. The amplifier of claim 1 wherein said programmable component includes at least an input to activate reading out and varying the desired value signals stored in the read-only-memory.

6. The amplifier of claim 1, wherein said programmable unit includes at least an input to receive an signal in case of a failure to reset the positioning signal for the valve in a predetermined stage by means of the program.

7. The amplifier of claim 1, wherein said programmable unit includes at least a pair of inputs for a start-stop-operation to continuously vary the positioning signal for the valve.

8. The amplifier of claim 1, wherein said programmable unit includes inputs for a keyboard.

9. The amplifier of claim 1, wherein said programmable unit includes a multiplexer for analogue signal inputs of desired values and actual values.

10. The amplifier of claim 1, wherein said valve is controlled via said interface from an external processor.

11. The amplifier of claim 1, wherein the data stored in the read-only-memory are read out via said interface and wherein said data are varied.

12. The amplifier of claim 1, wherein said supporting member is provided with a supplementary member incorporating said programmable unit and said read-only-memory.

13. The amplifier of claim 1, wherein said supporting member is selectively mounted on said valve to be controlled or a valve sandwich plate or mounted in a housing or provided with a front plate accommodating actuating and display elements.

14. The amplifier of claim 1, wherein specific values of a valve are loaded in the read-only-memory.

15. The amplifier of claim 1, wherein the supporting member is provided with a front plate accommodating actuating and display elements.

* * * * *